United States Patent [19]
Brillouet et al.

[11] Patent Number: 5,278,858
[45] Date of Patent: Jan. 11, 1994

[54] DOUBLE CHANNEL SEMICONDUCTOR LASER AND METHOD OF FABRICATING IT

[75] Inventors: François Brillouet, Sevres; Patrick Garabedian, Arpajon; Léon Goldstein, Chaville; Philippe Pagnod-Rossiaux, Saint Germain les Arpajon, all of France

[73] Assignee: Alcatel CIT, Paris, France

[21] Appl. No.: 915,512

[22] Filed: Jul. 20, 1992

[30] Foreign Application Priority Data

Jul. 19, 1991 [FR] France .................. 91 09178

[51] Int. Cl.⁵ .................................................. H01S 3/19
[52] U.S. Cl. .................................... 372/46; 372/45; 437/129
[58] Field of Search ................... 372/46, 45, 43; 437/129

[56] References Cited

U.S. PATENT DOCUMENTS

| | | | |
|---|---|---|---|
| 4,870,650 | 9/1989 | Mink | 372/46 |
| 4,947,400 | 8/1990 | Dutta | 372/50 |

FOREIGN PATENT DOCUMENTS

| | | | |
|---|---|---|---|
| 0161016 | 11/1985 | European Pat. Off. | |
| 0110085 | 6/1983 | Japan | 372/46 |
| 0203282 | 9/1991 | Japan | 372/46 |

OTHER PUBLICATIONS

Patent Abstracts of Japan, vol. 8, No. 250 (E-279) Nov. 16, 1984 & JP-A-59 125 684 (Nippon Denki K.K.).
Patent Abstracts of Japan, vol. 14, No. 190 (E-91) Apr. 18, 1990 & JP-A-2 039 483 (NEC Kansai Ltd.).
Japanese Journal of Applied Physics, vol. 25, No. 6, Jun. 1986, Part II, Tokyo, Japan, pp. 435–436.
S. L. Shi et al.: "BH InGaAsP lasers with an LPE grown semi-insulating layer".
Patent Abstracts of Japan, vol. 12, No. 261 (E-636) Jul. 22, 1988 & JP-A-63 046 790 (NEC Corp.).
Neues Aus Der Technik, No. 1, Feb. 20, 1987, Wurzburg, Germany, p. 6; "Eisenimplantierter DCPBH-Laser".

Primary Examiner—Georgia Y. Epps
Attorney, Agent, or Firm—Sughrue, Mion, Zinn, Macpeak & Seas

[57] ABSTRACT

The energization current of an indium phosphide or gallium arsenide double channel semiconductor laser is confined within a laser stripe by near and far current blocking arrangements. The near current blocking arrangements are formed by a blocking junction formed in two lateral channels delimiting the stripe. The far current blocking arrangements are formed by an iron-doped semi-insulative layer grown epitaxially before the lateral channels are etched. A particular application is to the fabrication of pump lasers used in optical amplifiers of optical fiber links.

12 Claims, 5 Drawing Sheets

DOUBLE CHANNEL SEMICONDUCTOR LASER AND METHOD OF FABRICATING IT

BACKGROUND OF THE INVENTION

1. Field of the invention

The present invention concerns the fabrication of a double channel semiconductor laser.

2. Description of the prior art

This type of laser structure is internationally known by the acronym DCPBH which stands for "Double Channel Planar Buried Heterostructure". It may be fabricated from a base material in the form of indium phosphide and an active material further comprising gallium arsenide. It can then be used as a pump laser emitting a wavelength of 1 480 nm that can be used in long-haul fiber optic links including erbium-doped amplifying fibers.

A laser of this kind comprises the following elements which, in terms of their functions as stated hereinafter, are common to prior art lasers and a laser in accordance with the invention and which, in the case of a laser in accordance with the invention, are as shown in transverse cross-section in FIG. 1:

A (usually semiconductor) wafer 2 featuring internal crystal lattice continuity and having a thickness between two main surfaces 4, 8. The wafer defines a vertical direction Z which is that of its thickness and longitudinal X and transverse Y directions which are horizontal and mutually perpendicular. The two main surfaces are a lower surface 4 covered with a lower electrode 6 and an upper surface 8 covered with an upper electrode 10. The wafer is made up of layers in vertical succession from the lower surface to the upper surface. It has diversified areas extending longitudinally and juxtaposed transversely. One such area is a stripe area ZR in which the wafer comprises the following successive layers:

a lower injection layer 25 having a first type of conductivity, an active layer 14 constituting a laser stripe 14A within the area ZR, and an upper injection layer 16 having a second type of conductivity.

These layers constitute an active system. They are so fabricated that a polarization current connected via the electrodes 6, 10 injects vertically into the laser stripe 14A from the injection layer charge carriers of opposite types enabling the amplification of laser light within the stripe. The stripe has a refractive index which is higher than that of the surrounding layers 12, 25, 16, 26, 20, 22 to constitute a guide for this light. The injection layers extend transversely beyond the stripe area. The wafer 2 has two transverse sequences of areas each running from a respective side of the stripe area ZR. Each such succession comprises firstly a near lateral area ZC in which a lateral channel CL is substituted for the upper injection layer, the active layer and at least an upper part of the lower injection layer. This channel comprises a lower blocking layer 20 having the second type of conductivity on top of which is an upper blocking layer 22 having the first type of conductivity, so that the two blocking layers form between them a blocking junction JB for the polarization current constituting near current blocking means tending to confine the current within the stripe area ZR.

The transverse sequence of areas secondly comprises a far lateral area ZD in which an electrically resistive layer constitutes far current blocking means cooperating with the near current blocking means to confine the polarization current within the stripe area. The implementation of the far current blocking means is specific to the present invention and will be described in more detail later.

Still referring to features common to prior art lasers and a laser in accordance with the invention, the blocking layers 20, 22 extend into the far lateral area but not into the stripe area, this being achieved by the use of appropriate epitaxial growth techniques to grow layers. The blocking junction that they form blocks the current in the channels because they are thick enough here. On the other hand, the blocking is less than perfect in the far lateral layers beause they are thinner there.

This is why far current blocking means are required.

The upper injection layer 16 and these blocking layers have on top of them a thicker additional layer 26 having the second type of conductivity on top of which is a more strongly doped contact layer 28.

Two mirrors (not shown) are formed by the longitudinally remote surfaces of the semiconductor wafer to constitute a laser emitter.

A first prior art laser comprising these common features and arrangements is described in the JAPANESE JOURNAL OF APPLIED PHYSICS. vol. 25, No 6, June 1986, PART II, TOKYO, JP pages 435–436; S.L. SHI ET AL: "BH INGaAsP lasers with an LPE grown semi-insulating layer".

In this laser the energizing current is blocked in the near lateral area and in the far lateral area by three stacked layers grown epitaxially. Two of these layers form a blocking semiconductor junction. The third comprises modifying impurities (cobalt) imparting sufficient electrical resistivity to it for it to be semi-insulative.

This arrangement has the drawback that pinching of the layer deposited in this way may occur at the outer edges of the channels, that is to say at the boundary between the near and far lateral areas. Any such pinching prevents the required electrical confinement.

A second prior art laser comprising these common features and arrangements is described in European patent EP-A 161 016 (Philips).

In the second prior art laser the far current blocking means are formed, after a wafer is fabricated as previously described, by ionic bombardment localized to the far lateral area which induces therein crystalline defects increasing the resistivity of the base material. Protons are used for the ionic bombardment to achieve an adequate depth of penetration. The electrical resistivity created in the area in this way may initially be sufficiently high to enable correct operation of the laser. However, the crystalline defects which are the reason for this are progressively healed if the temperature of the wafer increases, which reduces the reliability and the range of uses of the laser.

An object of the present invention is to enable simple fabrication of a laser which is reliable even at high temperatures and which is easy to manipulate, even during fabrication.

SUMMARY OF THE INVENTION

In one aspect, the present invention consists in a double channel semiconductor laser wherein the energization electrical current is confined within a laser stripe by near current blocking means formed in lateral channels which delimit the laser stripe and beyond said channels and directly from the outer flank thereof by an internal semi-insulative layer whose crystal lattice is continuous with the semiconductor layers of the laser.

In another aspect, the present invention consists in a method of fabricating a double channel semiconductor laser comprising the following operations:

fabricating a semiconductor substrate having a first type of conductivity, after fabricating said substrate, epitaxially growing a lower injection layer having said first type of conductivity, after growing said lower injection layer, epitaxially growing an active layer comprising an active material adapted to amplify laser light by recombination of opposite type charge carriers, after growing said active layer, epitaxially growing an upper injection layer having said second type of conductivity whereby a polarization current flowing subsequently between said two injection layers injects into said active layer the charge carriers of opposite type needed to amplify the laser light, after growing said active layer, etching two channels in the same longitudinal direction and locally eliminating said upper injection layer, said active layer and at least an upper part of said lower injection layer so that the parts of the layers previously grown remaining between said channels constitute a mesa having two edges and the part of the active layer included in said mesa constitutes a laser stripe with respect to which said channels constitute lateral channels, each of said channels having an outer edge spaced from said mesa, after etching said lateral channels, epitaxially growing a lower blocking layer having said second type of conductivity and then an upper blocking layer having said first type of conductivity, said growth stages being carried out in such a way that said layers are formed in said channels and stop at the edges of said mesa and so that a blocking junction formed by said layers constitutes near current blocking means locally opposing the flow of said polarizing current, and after fabricating said substrate, forming an electrically resistive layer in far lateral areas extending transversely beyond the outer edges of said lateral channels so as to constitute far current blocking means cooperating with said near current blocking means to confine said polarization current to said laser stripe, in which method:

said far current blocking means are formed by epitaxially growing a semi-insulative layer before etching said lateral channels, said semi-insulative layer being localized to prevent it being present in a stripe area when fabrication of the laser is completed, said stripe area being the part of the surface of said wafer which incorporates said laser stripe.

A description of how the present invention may be put into effect will now be given by way of non-limiting example only with reference to the appended diagrammatic drawings.

DETAILED DESCRIPTION OF THE INVENTION

Figure 1:
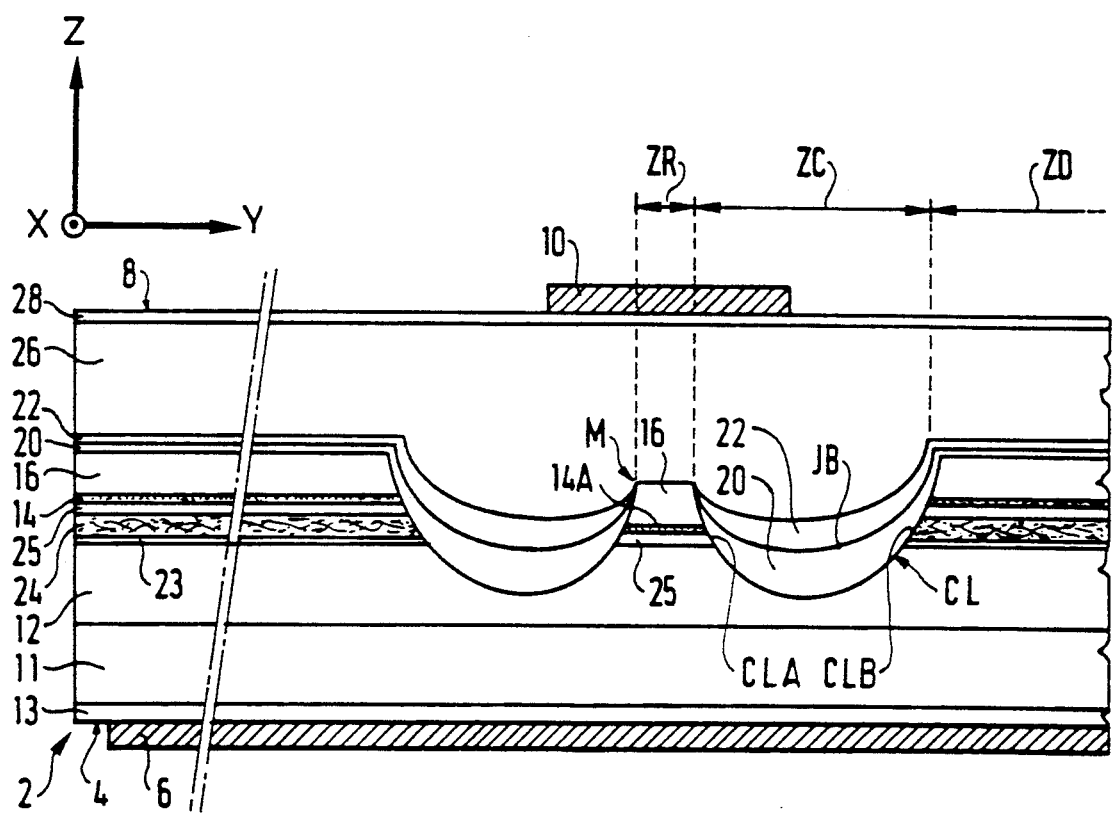
FIG. 1 shows a first laser in accordance with the present invention in transverse cross-section.

Referring to FIG. 1, a laser in accordance with the invention comprises the common features and arrangements previously referred to. Its far current blocking means are provided by a semi-insulative layer 24 whose crystal lattice is continuous with an active system comprising the active layer 14 between the lower and upper injection layers 25 and 16. The semiconductor wafer 2 comprises, in each far lateral area ZD, a vertical succession of layers comprising the semi-insulative layer 24 and the active system between lower and upper external optical confinement layers 12 and 26 which lie one on each side of the active system and which, in the stripe area ZR, cooperate with the lower and upper injection layers to confine the laser light in the laser stripe 14A.

The semi-insulative layer and the lower and upper injection layers are made from the same semiconductor base material and comprise different modifying impurities selected to confer upon these layers a resistivity and respectively the first and second types of conductivity. The base material is indium phosphide or gallium arsenide and the modifying impurity of the semi-insulative layer comprises iron, cobalt, titanium and/or chromium.

In the first and second lasers in accordance with the invention the base material is indium phosphide or gallium arsenide. The modifying impurity of the semi-insulative layer is then iron, for example, with a concentration between $10^{16}$ and $10^{18}$ and typically around $10^{17}$ atoms per cm$^3$. This layer is between 300 and 3 000 nm thick, typically around 700 nm. Silicon and zinc or beryllium n and p type "doping" modifier impurities confer the first and second types of conductivity.

Note that the electrical resistivity due to the presence of the iron atoms might be termed intrinsic resistivity because it does not result from the formation of geometrical defects of the crystal lattice and so is not reduced by an increase in temperature.

A laser in accordance with the invention may be fabricated by the following operations which are known in respect of their functions as indicated and are shown in FIGS. 2 through 6 in the case of the first laser in accordance with the invention:

Fabrication of a semiconductor substrate 11 carrying a lower external optical confinement layer 12 having a first type of conductivity.

After fabrication of this substrate, epitaxial growth of a lower injection layer 25 having the same type of conductivity and then an active layer 14 (see FIG. 4) comprising an active material adapted to amplify laser light by recombination of opposite type charge carriers.

After growth of this active layer, epitaxial growth of an upper injection layer 16 having the second type of conductivity so that an energizing current flowing subsequently from one injection layer 16 to the other injection layer 25 injects into the active layer 14 the opposite type charge carriers required to amplify the laser light.

After growth of the active layer, etching of two channels CL (FIG. 5) in a common longitudinal direction X locally eliminating the upper injection layer 16, the active layer 14 and at least an upper part of the lower injection layer 25. Parts of the previously grown layers remain between the channels and constitute a mesa M having two edges BI. The part of the active layer incorporated in this mesa constitutes a laser stripe 14A with respect to which these channels constitute lateral channels. Each of these channels has an inner flank CLA constituting one flank of the laser and an outer flank CLB whose upper edge constitutes an external edge BE spaced from the mesa.

After etching of the lateral channels CL, epitaxial growth of a lower blocking layer 20 (FIG. 6) having the second type of conductivity and then an upper blocking layer 22 having the first type of conductivity, these growth stages being carried out in the liquid phase, for example, so that these layers form in the channels and stop at the edges BI of the mesa M and so that a blocking junction JB formed by these layers constitutes near current blocking means for localized prevention of the passage of the polarization current.

Far current blocking means must cooperate with the near current blocking means JB to confine the polarization currents to the laser stripe 14A.

The far current blocking means are formed by epitaxial growth of a semi-insulative layer 24 before the lateral channels are etched. As before, a localized semi-insulative layer arrangement is used to prevent this layer remaining in the stripe area when fabrication of the laser is completed, this area being the part of the laser surface which incorporates the laser stripe.

The semi-insulative layer is preferably grown in a non-localized manner which forms this layer also in the stripe area, the localized arrangement of the semi-insulative layer being achieved by a first operation to etch this layer which eliminates it in a first semi-insulative layer etch area comprising the stripe area and extending transversely beyond the stripe area to the boundaries of the first semi-insulative layer etch, the etching of the lateral channels eliminating a further part of this semi-insulative layer near these boundaries.

The fact that the inner boundary of the semi-insulative layer of the laser is formed by the operation to etch the lateral channels means that this layer runs exactly from the outer flank CLB of a channel, avoiding any risk of spurious electrical current flow between this flank and the edge of this layer.

An etch barrier layer 23 is grown before the semi-insulative layer 24. It comprises a ternary semiconductor material, for example. It limits the depth of the first semi-insulative layer etch. The lateral extent of this etch is limited by a known type mask. This etching may cause, near the boundaries LG, defects susceptible to create subsequently spurious paths for the laser polarization current. The regions possibly featuring such defects are eliminated by the subsequent etching of the lateral channels CL.

The first semi-insulative layer 24 etch is facilitated if the longitudinal direction X, transverse direction Y and vertical direction Z are the respective crystallographic directions (110), (1–10) and (001).

To be more precise, in the first laser in accordance with the invention a semi-insulative layer 24 is carried by the lower external optical confinement layer 12 through the intermediary of the etched barrier layer 23 and on top of it is the lower injection layer 25 on top of which is the active layer 14.

This first laser may be fabricated as follows.

Figure 2:
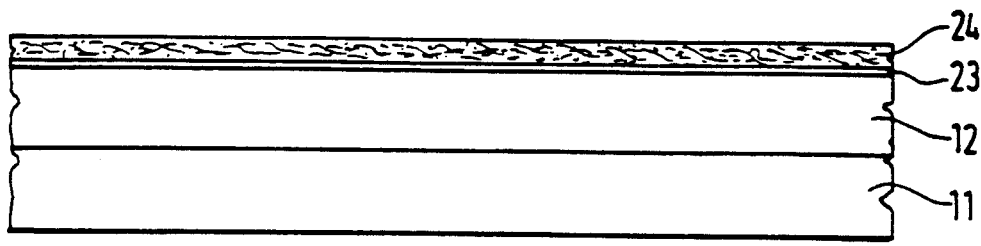
FIGS. 2 through 6 are views of this laser in transverse cross-section at various stages in its fabrication.

Referring to FIG. 2, the etch barrier layer 23 and the semi-insulative layer 24 are grown epitaxially on the lower external optical confinement layer 12. The impurity of the latter is deposited at the same time as the base material, but could be introduced subsequently, for example by ionic implantation.

Figure 3:
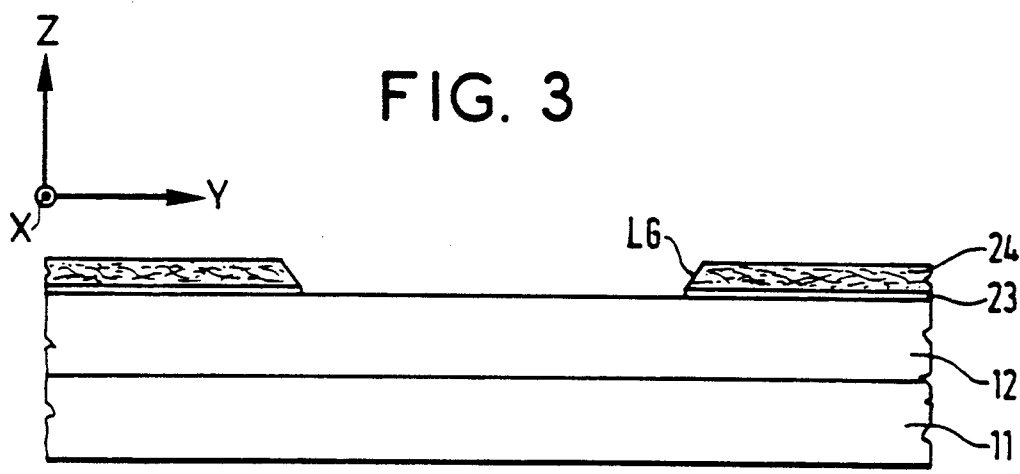

Referring to FIG. 3, the layers 23 and 24 are etched to a width of around 10 000 nm, for example. This is the first semi-insulative layer etch.

Figure 4:
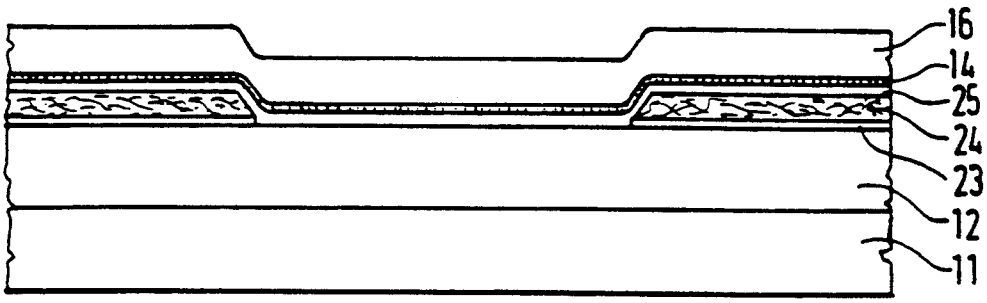

Referring to FIG. 4, a first gas phase epitaxial growth stage carried out at approximately 500° C. grows the lower injection layer 25, the active layer 14 and the upper injection layer 16.

Figure 5:
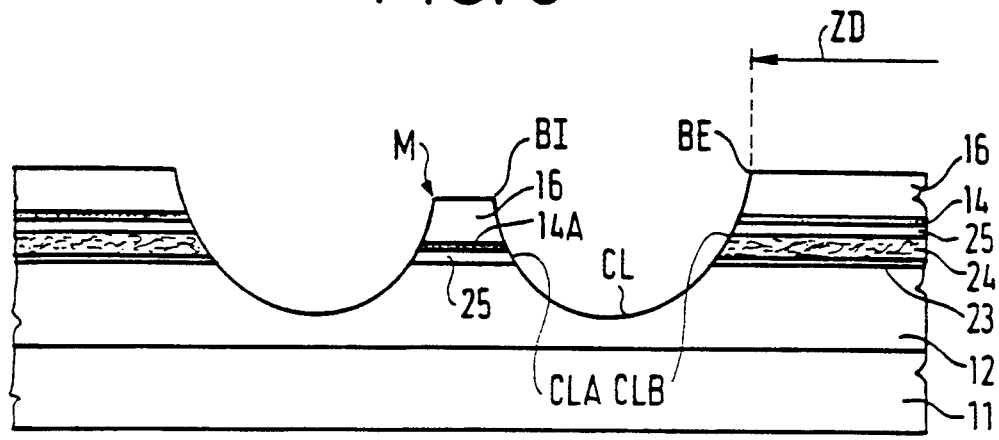

Referring to FIG. 5, the two lateral channels CL are etched. The distance between their outer edges BE is 20 000 nm, for example. Their inner edges BI constitute the edges of the mesa M. The distance between them is the width of this mesa, which is around 2 000 nm, for example.

Figure 6:
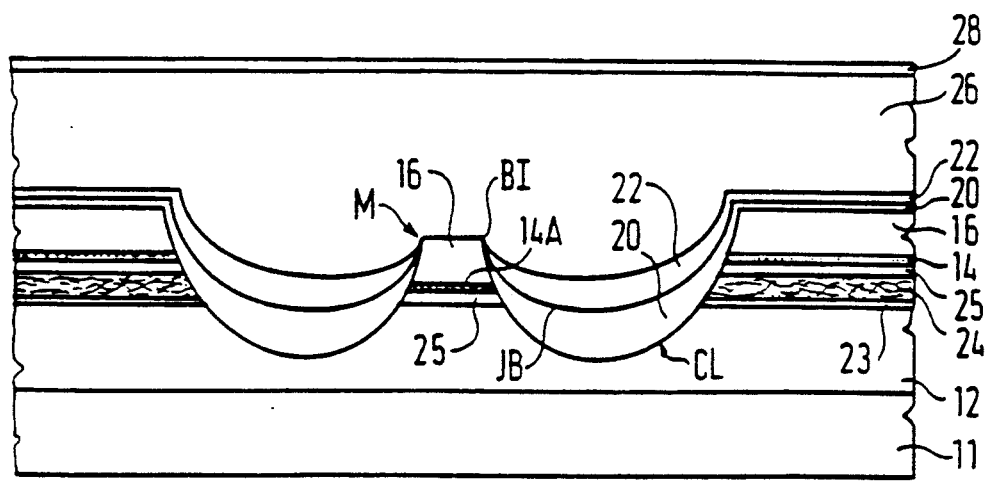

Referring to FIG. 6, a second stage of liquid phase epitaxial growth grows the lower blocking layer 20 and the upper blocking layer 22. The liquid used for this operation must be prevented from overflowing onto the mesa. A technique used previously to the present invention is employed to this effect, based on the fact that a liquid of this kind tends to avoid steeply sloped projections and particularly projections between two closely spaced steep slopes like the flanks of the mesa with the edges BI. In the present example this risk is increased, however, because the top of the mesa M is lower than the plateau formed in the far area ZD by the upper injection layer which the liquid has to cover. The difference in height is approximately equal to the thickness of the semi-insulative layer 24 previously grown and etched.

This is why the thickness of this layer is restricted. It is also why the width of the lateral channels is slightly greater than those previously adopted. Because of this increased width the growth time is slightly greater than those previously used.

The layers 26 and 28 are then grown during the same epitaxial growth phase.

As described above, during the fabrication of the first laser in accordance with the invention the semi-insulative layer 24 was grown before and therefore ended up under the active system 25, 14, 16. In the fabrication of the second laser in accordance with the invention now to be described, the semi-insulative layer is grown after and therefore on top of the active system.

Every element of the second laser is as a general rule functionally analogous to an element of the first laser and is identified by the same reference number increased by 100.

This second laser may be fabricated as follows.

Figure 7:
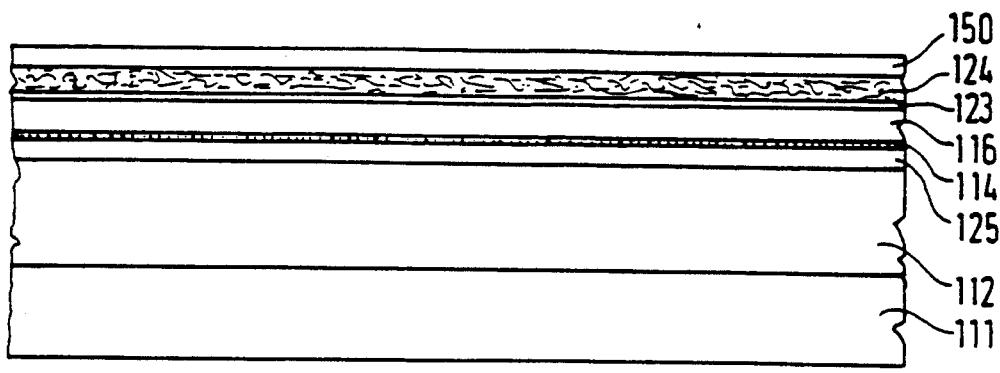
FIGS. 7 through 10 are views in transverse cross-section of a second laser in accordance with the present invention at successive stages in its fabrication.

Referring to FIG. 7, a gas phase epitaxial growth stage grows onto the lower optical confinement layer 112 carried by the semiconductor substrate 111 the lower injection layer 125, the active layer 114, the upper injection layer 116, the etch barrier layer 123, the semi-insulative layer 124 and an additional layer of the same kind as the layer 116 called the semi-insulative material covering layer 150.

Figure 8:
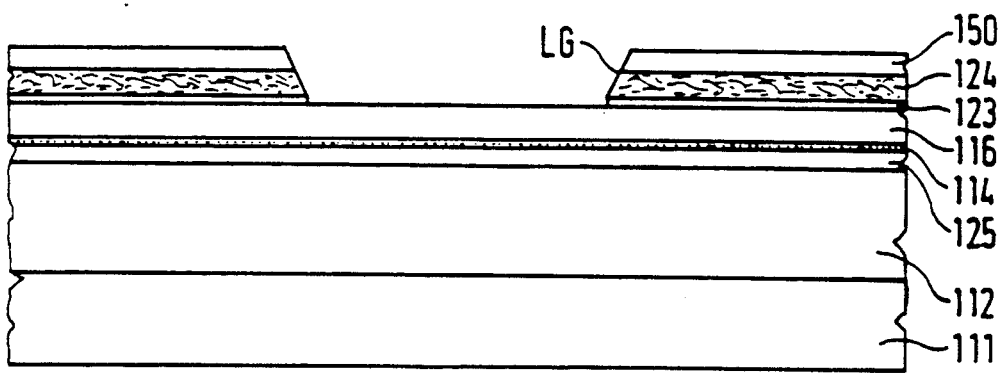

Referring to FIG. 8, these layers are etched to expose the upper injection layer 116.

Figure 9:
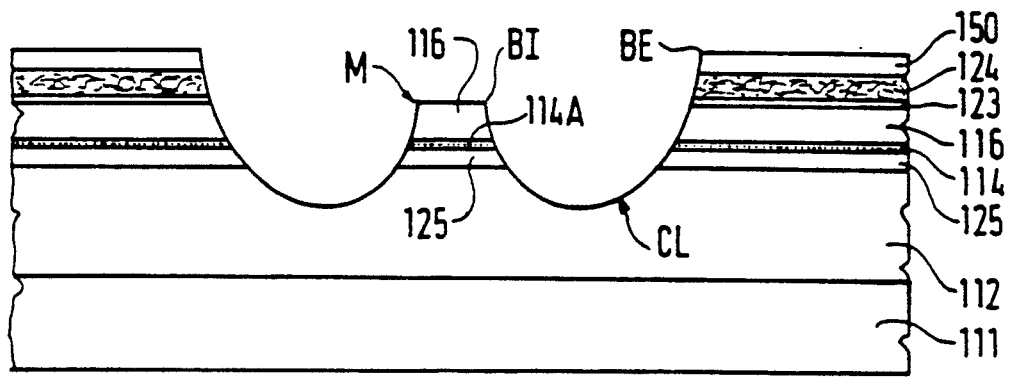

Referring to FIG. 9, the lateral channels CL are etched.

Figure 10:
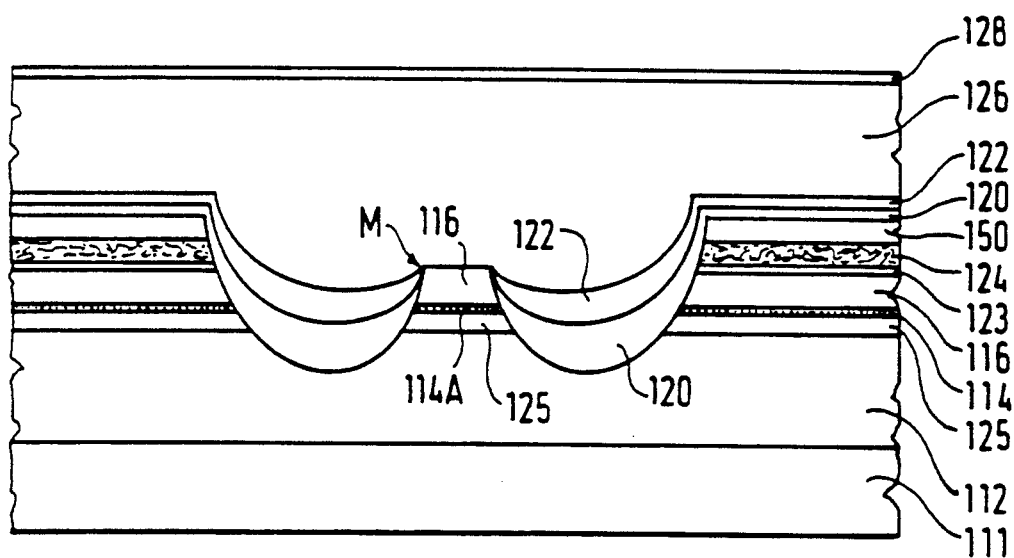

Referring to FIG. 10, a single liquid phase epitaxial growth stage grows the blocking layers 120 and 122, the upper external optical confinement layer 126 and the upper contact layer 128.

There is claimed:

1. Double channel semiconductor laser wherein the energization electrical current is confined within a laser stripe by near current blocking means formed in lateral channels which delimit a laser stripe and beyond said channels and directly from the outer flank thereof by an internal semi-insulative layer whose crystal lattice is continuous with the semiconductor layers of the laser.

2. Laser according to claim 1 comprising a (usually semiconductor) wafer having internal crystal lattice continuity and two main surfaces, a lower surface covered with a lower electrode and an upper surface covered with an upper electrode, said wafer defining an upward vertical direction from said lower surface to said upper surface and a longitudinal direction and a transverse direction which are horizontal and mutually perpendicular, said wafer comprising layers in succession in said upward vertical direction, a horizontal surface of said wafer comprising diversified areas extending longitudinally and juxtaposed transversely, one of said areas being a stripe area in which said wafer comprises the following successive layers:

a lower injection layer which has a first type of conductivity, an active layer in contact with said lower injection layer and which constitutes a laser stripe in said area, and an upper injection layer in contact with said active layer and which has a second type of conductivity so that a polarizing current connected via said electrodes injects vertically into said laser stripe from said injection layer charge carriers of opposite types enabling amplification of laser light in said stripe, said lower and upper injection layers and said active layer constituting an active system, optical confinement layers comprising at least an upper and a lower optical confinement layer being disposed below and above said active layer, respectively, and interacting optically with said active layer, said optical confinement layers and lateral optical confinement layers disposed to either side of said laser stripe having refractive indices lower than that of said active layer so that said laser stripe constitutes a light guide, said injection layers and optical confinement layers extending transversely beyond said stripe area, said wafer having two transverse successions of areas each running from a respective side of said stripe area, each such succession comprising firstly a near lateral area in which a lateral channel is substituted for said active layer and at least an upper part of said lower injection layer, said channel having an inner flank delimiting laterally said laser stripe and an outer flank opposite said inner flank, said channel comprising a lower blocking layer having said second type of conductivity on top of which is an upper blocking layer having said first type of conductivity whereby said two blocking layers form between them, with respect to said polarizing currents, a blocking junction constituting near blocking current means locally opposing the flow of said current, said transverse succession of areas secondly comprising a far lateral area in which a semi-insulative layer constitutes far current blocking means cooperating with said near current blocking means to confine said polarizing current in said stripe area, said semi-insulative layer having a crystal lattice continuous with said lower and upper injection layers and comprising modifying impurities conferring on it an intrinsic electrical resistivity, and said semi-insulative layer extending transversely in said far lateral area from said external flank of said lateral channel.

3. Laser according to claim 2 wherein said semiconductor wafer has in each far lateral area a vertical succession of layer comprising said semi-insulative layer and said active system between lower and upper external optical confinement layers which constitute two of said optical confinement layers.

4. Laser according to claim 2 wherein said semi-insulative layer and said lower and upper injection layers are made from the same semiconductor base material and comprise different modifying impurities chosen to confer upon said layers resistivity and respectively said first and second types of conductivity.

5. Laser according to claim 4 wherein said base material is indium phosphide or gallium arsenide and said modifying impurity of said semi-insulative layer comprises iron, cobalt, titanium and/or chromium.

6. Laser according to claim 3 wherein said semi-insulative layer is between said lower external optical confinement layer and said active system.

7. Laser according to claim 3 wherein said semi-insulative layer is between said active system and said upper external optical confinement layer.

8. Method of fabricating a double channel semiconductor laser comprising the following operations:

fabricating a semiconductor substrate having a first type of conductivity, after fabricating said substrate, epitaxially growing a lower injection layer having said first type of conductivity, after growing said lower injection layer, epitaxially growing an active layer comprising an active material adapted to amplify laser light by recombination of opposite type charge carriers, after growing said active layer, epitaxially growing an upper injection layer having said second type of conductivity whereby a polarization current flowing subsequently between said two injection layers injects into said active layer the charge carriers of opposite type needed to amplify the laser light, after growing said active layer, etching two channels in the same longitudinal direction and locally eliminating said upper injection layer, said active layer and at least an upper part of said lower injection layer so that the parts of the layers previously grown remaining between said channels constitute a mesa having two edges and the part of the active layer included in said mesa constitutes a laser stripe with respect to which said channels constitute lateral channels, each of said channels having an outer edge spaced from said mesa, after etching said lateral channels, epitaxially growing a lower blocking layer having said second type of conductivity and then an upper blocking layer having said first type of conductivity, said growth stages being carried out in such a way that said layers are formed in said channels and stop at the edges of said mesa and so that a blocking junction formed by said layers constitutes near current blocking means locally opposing the flow of said polarizing current, and after fabricating said substrate, forming an electrically resistive layer in far lateral areas extending transversely beyond the outer edges of said lateral channels so as to constitute far current blocking means cooperating with said near current blocking means to confine said polarization current to said laser stripe, in which method:

said far current blocking means are formed by epitaxially growing a semi-insulative layer, said semi-insulative layer being localized to prevent it being present in a stripe area when fabrication of the laser is completed, said stripe area being the part of the surface of said wafer which incorporates said laser stripe.

9. Method according to claim 8 wherein said semi-insulative layer is grown in a non-localized way so that said layer is formed also in said stripe area, the localization of said semi-insulative layer being achieved by a first etching of said layer which eliminates said layer in a semi-insulative layer first etch area comprising the stripe area and extending transversely beyond said stripe area as far as semi-insulative area first etch boundaries, the etching of said lateral channels eliminating a further part of said semi-insulative layer near said boundaries.

10. Method according to claim 8 wherein said semi-insulative layer is formed before said lower injection layer.

11. Method according to claim 8 wherein said semi-insulative layer is formed after said lower injection layer.

12. Method according to claim 8, wherein said semi-insulative layer is grown prior to etching said lateral channels.

* * * * *